United States Patent
Ledentsov

(10) Patent No.: US 8,576,472 B2
(45) Date of Patent: Nov. 5, 2013

(54) OPTOELECTRONIC DEVICE WITH CONTROLLED TEMPERATURE DEPENDENCE OF THE EMISSION WAVELENGTH AND METHOD OF MAKING SAME

(75) Inventor: Nikolay Ledentsov, Berlin (DE)

(73) Assignee: Nikolay Ledentsov, Berlin (DE)

( * ) Notice: Subject to any disclaimer, the term of this patent is extended or adjusted under 35 U.S.C. 154(b) by 321 days.

(21) Appl. No.: 12/925,707

(22) Filed: Oct. 28, 2010

(65) Prior Publication Data

US 2012/0105932 A1    May 3, 2012

Related U.S. Application Data

(60) Provisional application No. 61/277,051, filed on Sep. 21, 2009.

(51) Int. Cl.
*G02F 1/03*    (2006.01)

(52) U.S. Cl.
USPC ........................................................ 359/263

(58) Field of Classification Search
USPC ........................................................ 359/263
See application file for complete search history.

(56) References Cited

U.S. PATENT DOCUMENTS

| 7,130,102 B2 * | 10/2006 | Rabinowitz ............... 359/290 |
| 2006/0215252 A1 * | 9/2006 | Moriyama et al. ......... 359/296 |

* cited by examiner

*Primary Examiner* — James Jones

(57) ABSTRACT

A device representing a reflector, for example an evanescent reflector or a multilayer interference reflector, with at least one reflectivity stopband is disclosed. A medium with means of generating optical gain is introduced into the layer or several layers of the reflector. The optical gain spectrum preferably overlaps with the spectral range of the reflectivity stopband. This reflector is attached to multilayer passive cavity structure made of semiconducting, and/or dielectric, and/ or metallic materials with the inserted tools of achieving wavelength selection of the optical modes. For example, volume Bragg gratings, distributed feedback gratings or patterns, using of vertical optical cavities surrounded by multi-layer Bragg reflectors can be applied. The optical modes of the passive optical cavity partially penetrate into the gain region of the reflector. As a result of the interaction of the gain medium in the reflector region and the passive cavity modes, photons are generated or amplified in the passive cavity at wavelengths defined by the passive cavity modes. The materials selected for the passive cavity layers are chosen to provide the necessary temperature dependence of the effective index of refraction of the related optical modes of the passive cavity and serve as a tool to achieve the controlled temperature dependence of the wavelength of the emitted photons. In particular a complete suppression of the wavelength to temperature variations can be achieved. In another case a strong shift of the resonant wavelength or wavelengths with temperature may be realized. Thus the structure represents an optoelectronic device with controlled temperature dependence of the emission wavelength.

22 Claims, 14 Drawing Sheets

Fig. 1 Prior Art device: Distributed Feedback Laser

Fig. 2. Prior art device: vertical cavity surface-emitting laser

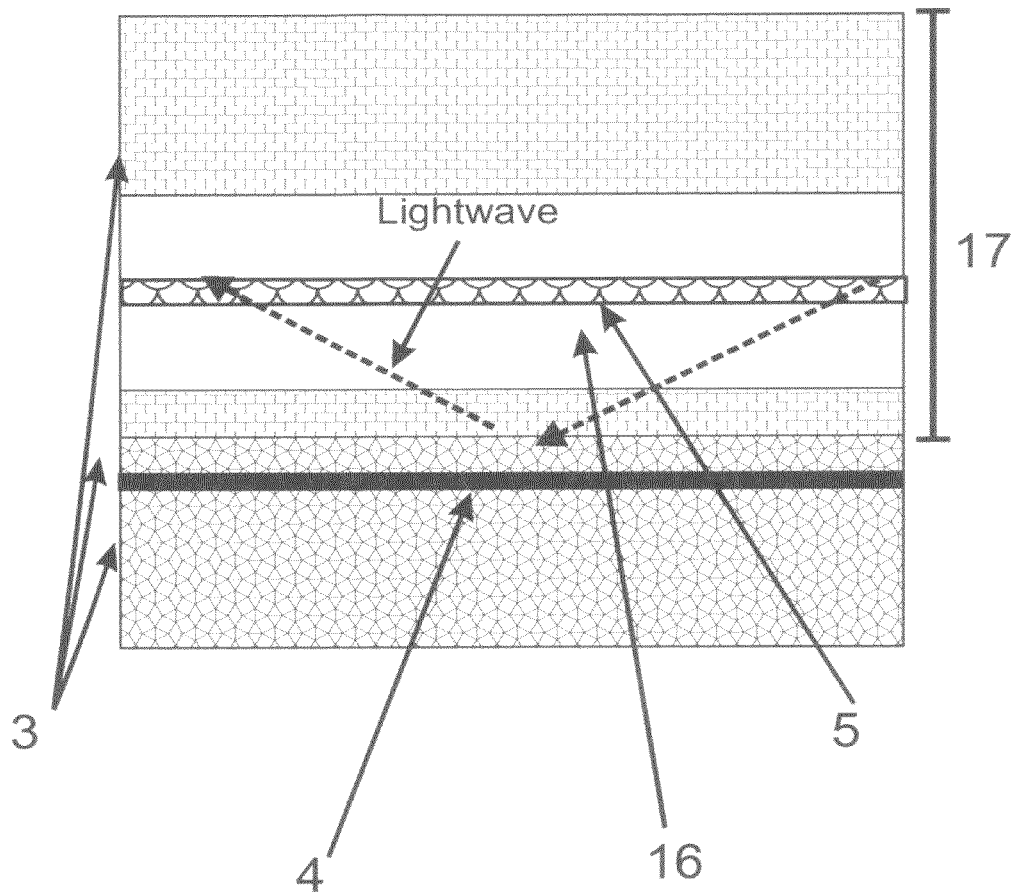
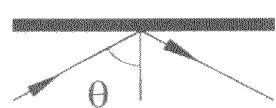
Fig. 6

OPTOELECTRONIC DEVICE WITH CONTROLLED TEMPERATURE DEPENDENCE OF THE EMISSION WAVELENGTH AND METHOD OF MAKING SAME

This application claims the benefit of U.S. Provisional Application No. 61/277,051, filed Sep. 21, 2009

BACKGROUND OF THE INVENTION

1. Field of the Invention

The invention pertains to the field of optoelectronic devices. More particularly, the invention pertains to semiconductor light emitting devices.

2. Description of Related Art

There is a need in light sources providing emission with the controlled temperature dependence of the emission wavelength. In certain cases it is highly desirable to achieve a high stability of the wavelength of the emitted light with respect to the temperature of the device. This is very important for uncooled light emitting devices, in particular lasers, for applications in frequency conversion, atomic clocking, solid state laser pumping, wavelength division multiplexing and in other fields. In frequency conversion the wavelength of the laser must match the narrow spectral range for the efficient frequency conversion of non-linear materials at all temperatures of operation of the device. In atomic clocks, the lasing wavelength must pump the atomic transitions and should remain stable with respect to any temperature change. For pumping of solid state lasers, including fiber lasers, laser or light-emitting diodes with temperature-insensitive wavelength are needed. In wavelength division multiplexing multiple optical signals at different wavelengths are to be multiplexed into a fiber and separated at the exit of the fiber. Usually this is made by using diffraction gratings, which reflect light beams of different wavelengths at different angles. Thus, once the optical beams at different wavelengths are exiting from the same single mode and directed to the diffraction grating by means of necessary optics, they can be separated in the angle space and consequently measured separately without mixing of the channels. When the system is targeting wavelength multiplexing, the same diffraction effect helps to combine different beams together in a single fiber or a waveguide. If the wavelength is not stable the channels may be mixed, for example, as the diffraction angle changes as the wavelength shifts, the light spot also shifts and enters the next channel.

To achieve wavelength stabilization several approaches have been introduced. The most widely spread approaches are:

using etched and overgrown diffraction grating introduced into the waveguide region of the laser. Distributed grating-based Bragg reflectors create a narrow region of the optical feedback replacing or complementing the modes of the conventional Fabri-Perot laser cavity.

in another approach the gain medium of the device is placed into the vertical optical cavity of the surface-emitting device, for example, vertical cavity surface-emitting laser (VCSEL). The cavity is confined by Bragg reflectors providing a high reflectivity, which is necessary to achieve vertical lasing in a rather thin cavity. The device in this geometry may also operate as resonant-cavity light-emitting diode (RC LED).

Other approaches include titled cavity laser, where the wavelength selection is realized via eptaxial layer sequence engineering of wavelength-selective losses, and tilted wave laser, where wavelength selectivity is realized by phase matching of the modes of two or more coupled waveguides with a different effective refractive index.

Even the wavelength of the emitted light in VCSELs and wavelength-stabilized edge emitters is fixed and the linewidth of the emission may be reduced dramatically, the wavelength stabilization is not complete. As the index of refraction changes with temperature, the resonant wavelength in the devices shifts. Furthermore, for the most of semiconductors, commonly used for market-relevant applications, the shift of the resonance features occurs as ~0.6-0.7 nm/K. For the typical range of operation temperatures from −20° C. to 85° C. this results in thermal shifts of the order of 6-7 nm. Assuming also the need of the separating "windows" to avoid mixing of the signal between the channels the narrowest allowable spacing between the channels may be around 9-10 nm. For example, in case of WDM system operating in the spectral range of 840-860 nm standardized for data transmission in multimode fiber only two wavelengths can be placed without the danger of either mixing of the signals or getting the laser wavelength outside of the standardized spectral range.

Closer spectral spacing already requires temperature stabilization and monitoring, thus increasing the cost and power consumption of the device or assembly.

Similar problems exist in other applications. Thus, there is a need in a simple way of achieving temperature-insensitive wavelength-stabilized operation.

On the other side in applications in sensing and/or generation of terahertz radiation, a scanning of the lasing wavelength over a certain spectral range is needed. This scanning can be realized by temperature change which is affecting the refractive index. However, in this case, a significant shift may be achieved only by a strong heating of the device. The heating affects other characteristics, such as threshold current, differential efficiency and operation lifetime and may degrade severely the device performance.

Thus there is also a need in devices capable to significant tuning of the wavelength with only a moderate change in temperature.

It is also important to note that there exist materials which demonstrate positive or negative changes of the refractive index with temperature. For example, oxides typically show a shift of the resonance wavelength<0.3 nm/K, some of the oxides and the co-sputtered mixed oxide films show quasi-zero or even a strongly negative change of the refractive index with temperature (H. Hirota, M. Itoh, M. Oguma, Y. Hibino "Temperature Coefficients of Refractive Indices of $TiO_2$-$SiO_2$ Films" Japanese Journal of Applied Physics Vol. 44, No. 2, 2005, pp. 1009-1010). Other dielectrics, organic and composite films may also provide a wide range of opportunities to control the thermal shift of the refractive index.

However, there are limited options to implement the results in lasers as the maximum intensity of the optical field is concentrated in the active cavity of the device, wand the effective refractive index of the optical mode is determined by the host material.

SUMMARY OF THE INVENTION

A device representing a reflector, for example an evanescent reflector or a multilayer interference reflector, with at least one reflectivity stopband is disclosed. A medium with means of generating optical gain is introduced into the layer or several layers of the reflector. The optical gain spectrum preferably overlaps with the spectral range of the reflectivity stopband. This reflector is attached to multilayer passive cavity structure made of semiconducting, and/or dielectric, and/or metallic materials with the inserted tools of achieving wavelength selection of the optical modes. For example, volume Bragg gratings, distributed feedback gratings or patterns can be applied. Vertical optical cavities surrounded by multilayer Bragg reflectors can be also used. The optical modes of the passive optical cavity partially penetrate into the gain region of the reflector. As a result of the interaction of the gain medium in the reflector region and the optical modes of the passive cavity, the photons are generated and/or amplified in the passive cavity at wavelengths defined by the passive cavity modes. The materials selected for the passive cavity layers are chosen to provide the necessary temperature dependence of the effective index of refraction of the related optical modes of the passive cavity and serve as a tool to achieve the controlled temperature dependence of the wavelength of the emitted photons. In particular a complete suppression of the wavelength to temperature variations can be achieved. In another case a strong shift of the resonant wavelength or wavelengths with temperature may be realized. Thus the structure represents an optoelectronic device with controlled temperature dependence of the emission wavelength, as opposite to conventional light-emitting device.

BRIEF DESCRIPTION OF THE DRAWINGS

FIG. 6 shows a device of the present invention. An optical mode is designed in the waveguide region. As an example, a diffraction grating acting as a tool for wavelength stabilization is introduced in the passive waveguide. Optical field of the mode partially overlaps with the gain medium placed in the evanescent reflector or the multilayer interference reflector.

DETAILED DESCRIPTION OF THE INVENTION

Figure 1:
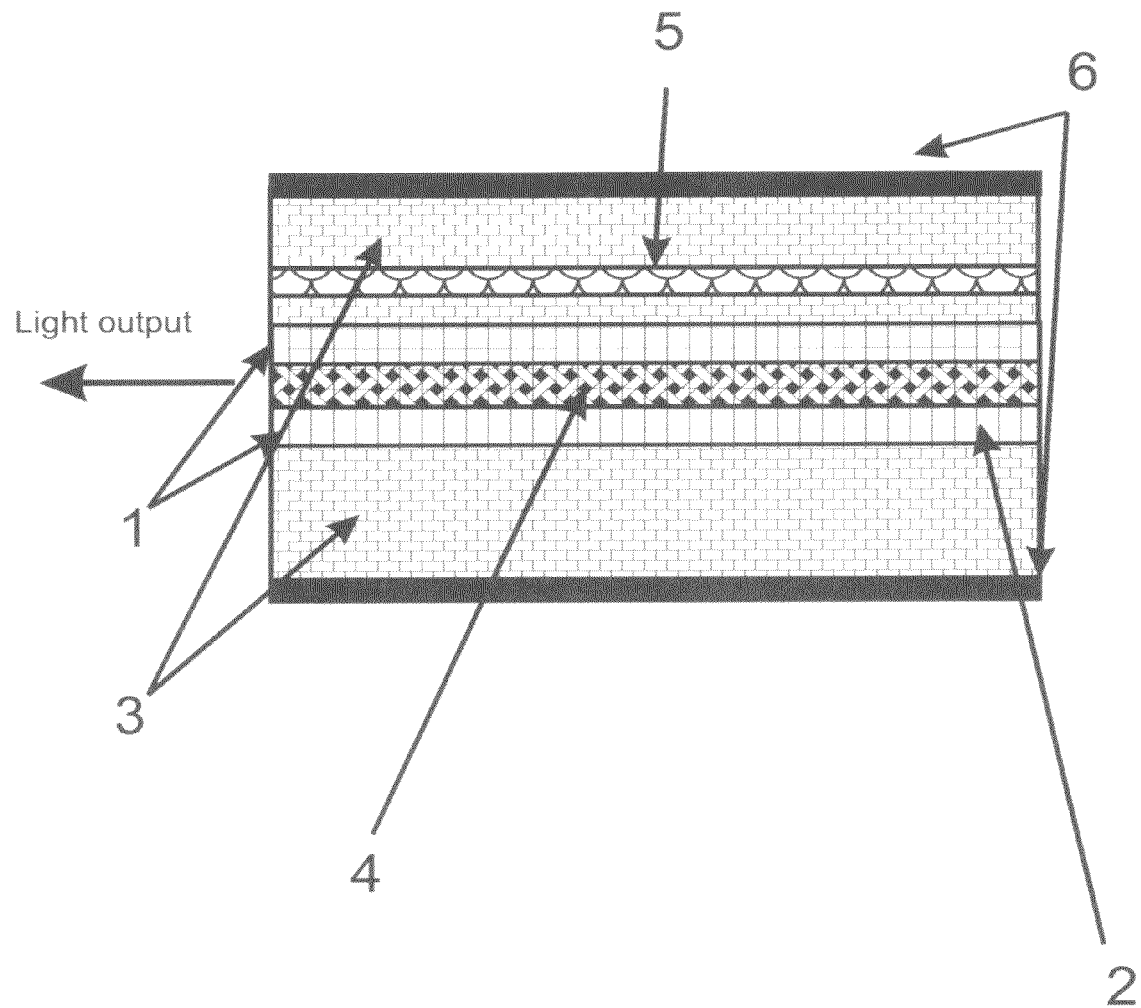
FIG. 1 shows a schematic representation of the prior art device in edge-emitting geometry.

A prior art device is shown on FIG. 1. The device represents an edge emitting distributed feedback laser. An optical cavity region (1) is composed of a waveguide structure (2) clad by two evanescent reflectors (3) having a smaller index of refraction. An optical gain region (4) is placed in the waveguide and tools of gain generation, for example, by current injection of nonequilibrium carriers into a p-n junction with the gain medium, are given. A diffraction grating (5) is etched inside or close to the waveguide in such a way that the optical modes of the cavity interact with the grating exhibiting constructive or destructive interference depending on the wavelength. Ohmic metal contacts (6) are provided to ensure low electrical resistance of the structure.

The substrate is formed from any III-V semiconductor material or III-V semiconductor alloy. For example, GaAs, InP, GaSb. GaAs or InP are generally used depending on the desired emitted wavelength of laser radiation. Alternatively, sapphire, SiC or [111]-Si is used as a substrate for GaN-based lasers, i.e. laser structures, the layers of which are formed of GaN, MN, InN, or alloys of these materials. The substrate is doped by an n-type, or donor impurity. Possible donor impurities include, but are not limited to S, Se, Te, and amphoteric impurities like Si, Ge, Sn, where the latter are introduced under such technological conditions that they are incorporated predominantly into the cation sublattice to serve as donor impurities.

The n-doped cladding layer is formed from a material lattice-matched or nearly lattice-matched to the substrate, is transparent to the generated light, and is doped by a donor impurity. In the case of a GaAs substrate, the n-doped cladding layer is preferably formed of a GaAlAs alloy.

The layer of the waveguide is formed from a material lattice-matched or nearly lattice-matched to the substrate, and is transparent to the generated light. In the case of a GaAs substrate, the layer (2) of the waveguide is preferably formed of GaAs or of a GaAlAs alloy having an Al content lower than that in the n-doped cladding layer.

Preferably, the p-doped cladding layer is formed from a material lattice-matched or nearly lattice-matched to the substrate, transparent to the generated light, and doped by an acceptor impurity. Possible acceptor impurities include, but are not limited to, Be, Mg, Zn, Cd, Pb, Mn and amphoteric impurities like Si, Ge, Sn, where the latter are introduced under such technological conditions that they are incorporated predominantly into the anion sublattice and serve as acceptor impurities.

Preferably, the p-doped cladding layer is formed from the same material as the n-doped cladding layer, but is doped by an acceptor impurity.

The p-contact layer is introduced close to the metal contact layer and is preferably formed from a material lattice-matched or nearly lattice matched to the substrate, transparent to the generated light, and doped by an acceptor impurity. The doping level is preferably higher than that in the p-cladding layer.

The metal contacts and are preferably formed from the multi-layered metal structures. The metal contact to n-doped layers is preferably formed from a structure including, but not limited to the structure Ni—Au—Ge. Metal contacts to p-doped layers are preferably formed from a structure including, but not limited to, the structure Ti—Pt—Au.

The active region is preferably formed by any insertion, the energy band gap of which is narrower than that of the waveguide layer. Possible active regions include, but are not limited to, a single-layer or a multi-layer system of quantum wells, quantum wires, quantum dots, or any combination thereof. In the case of a device on a GaAs-substrate, examples of the active region include, but are not limited to, a system of insertions of InAs, $In_{1-x}Ga_xAs$, $In_xGa_{1-x-y}Al_yAs$, $In_xGa_{1-x}As_{1-y}N_y$, or similar materials.

A grating is etched inside or in the vicinity of the waveguide layer. This grating provides feedback only for a certain wavelength of the waveguide mode and forces the device to lase at this wavelength.

Once the temperature is increased, the refractive index increases and the wavelength shifts typically at a rate of 0.05-0.08 nm/K. When wavelength stabilized operation is needed temperature stabilization and wavelength locking, for example, using an external filter with light transmission monitored by the feedback photoreceptor circuit can be used.

In case when a strong shift of the wavelength is needed, the device is excessively heated resulting in degradation of the performance and reliability.

Figure 2:
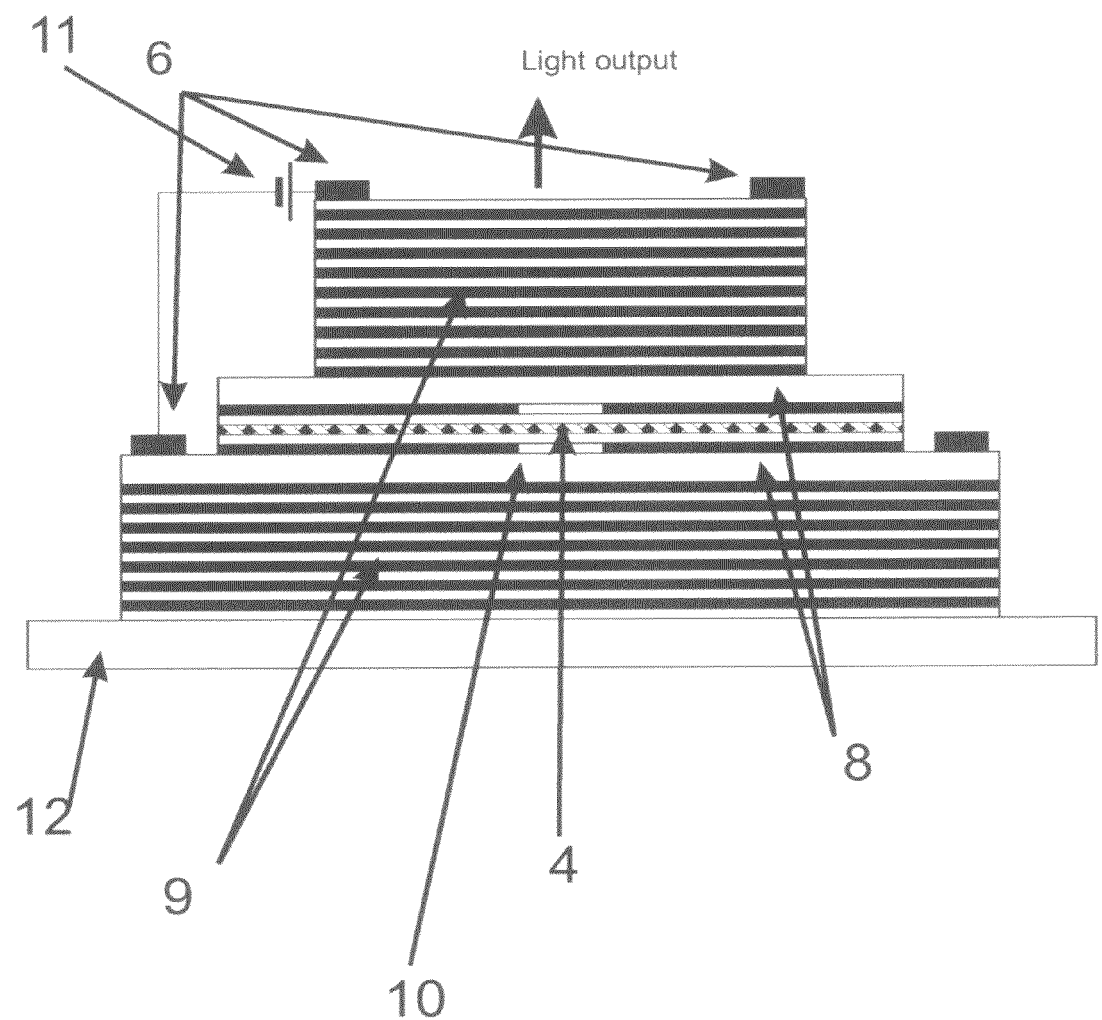
FIG. 2 shows another example of a prior art device in a vertical cavity geometry.

FIG. 2 shows another example of a prior art device. The gain medium (4) is placed in the vertical cavity region (7) of the vertical cavity surface emitting laser. Similar materials and doping schemes can be used. An optical cavity region (8) represents a vertical cavity structure clad by two multilayer interference reflectors (9) with a high reflectivity. Top reflector can be also made from dielectric layers. In some cases, when AlAs layers are used these can be selectively oxidized resulting in AlO—Al(Ga)As distributed Bragg refklectors. Top DBR can be also grown metamorphically. For example, InP-based VCSELs for the spectral range 1.27-1.6 µm may use metamorphic GaAs—AlAs DBRs and also oxidized AlO—Al(Ga)As DBRs. Metamorphic DBRs can be formed on patterned surfaces of the underlying layers. In principle, depending on the material of the substrate and the DBR layers and the number of periods the light outcoupling may take place towards the surface or towards the substrate.

Tools of gain generation, for example, by current injection of nonequilibrium carriers into a p-n junction with the gain medium, are given. A longitudinal vertical cavity mode is formed and defines the lasing wavelength. Means of the lateral confinement of the injected current are provided (10), for example, by proton bombardment, selective lateral etching or selective lateral oxidation. Ohmic metal contacts (6) are provided to ensure low electrical resistance of the structure. A current source (11) is provided to drive the current through the device. The light exits the device from the top surface or from the substrate (12) side (in case of transparent substrate).

Once the temperature is increased, the refractive index increases and the wavelength shifts typically at a rate of 0.05-0.08 nm/K. When wavelength stabilized operation is needed temperature stabilization and wavelength locking, for example, with respect to external filter monitored by the feedback photoreceptor circuit is used.

In case when a strong shift of the wavelength is needed, the device is excessively heated resulting in degradation of the performance and reliability.

Figure 3:
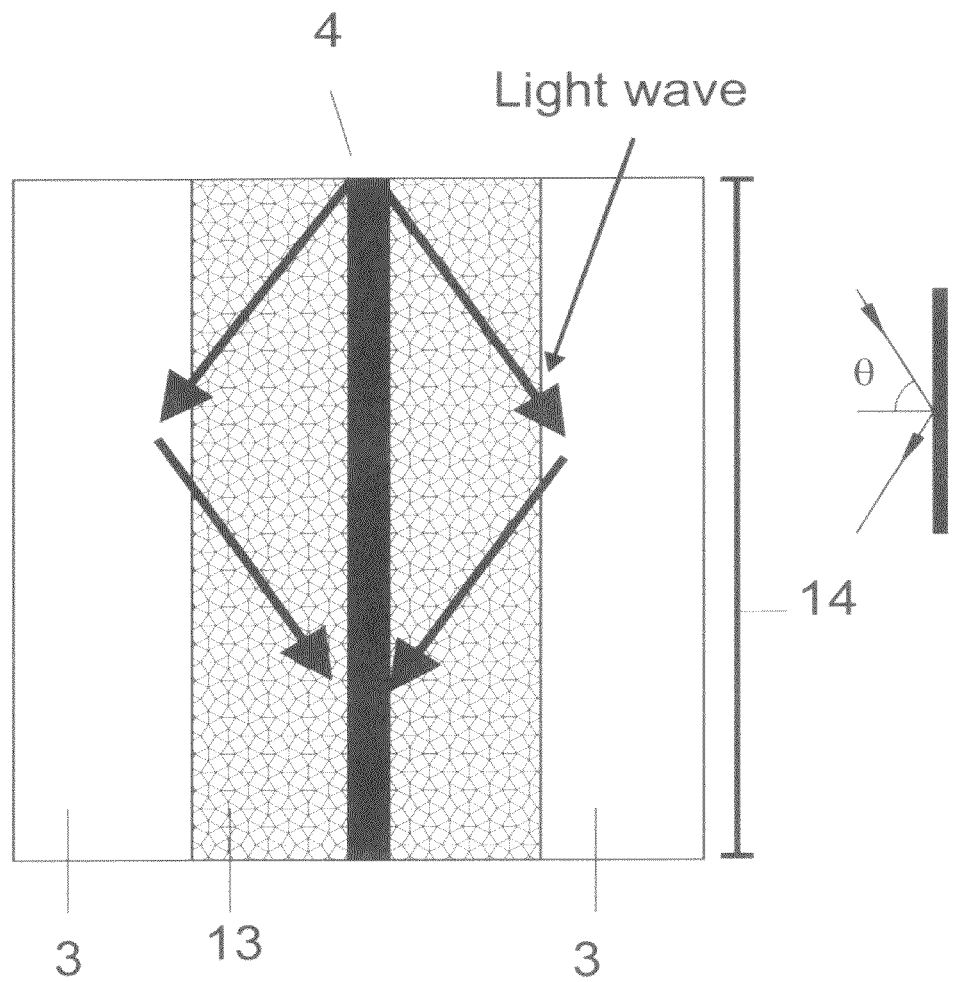
FIG. 3 shows an interaction of the light in the prior art device of FIG. 1 with the gain medium.

FIG. 3 explains a way of interaction of light in the prior art device of FIG. 1 with the gain medium. A layer composed of certain medium (13) is clad in one or both sides by reflectors, for example, evanescent reflectors composed of layers having a lower refractive index as compared to the medium. A Fabry-Perot resonator (14) is formed by the two cleaved facets. A gain region is introduced inside the medium. The geometrical dimensions of the medium region are large enough to support one or several transverse optical modes at different effective mode angles. All the optical waves (5) may have a significant overlap with the gain region and be amplified. Due to the final length of the device longitudinal Fabri-Perot modes are formed. The thermal shift of these modes with temperature is defined mostly by the refractive index temperature of the central region. As the variety of materials used in the waveguides of modern laser diodes is limited, the shift of the Fabri-Perot modes is typically within 0.5-0.8 nm/K. Thus, also for Fabry-Perot lasers the modes shift with temperature in the wavelengths space. This is extremely undesirable in multiwavelength, for example, so called COMB lasers or arrays of DFB lasers. In quantum dot COMB lasers the broad gain spectrum results in lasing via equidistant Fabry-Perot modes of similar intensity in a broad spectral range. These modes can be angle separated via diffraction grating and independently modulated by external modulators. When such an approach is applied to integrated waveguides with built-in modulators low cost WDM solutions become feasible. However, thermal shift of the modes makes low cost uncooled applications hardly possible.

Figure 4:
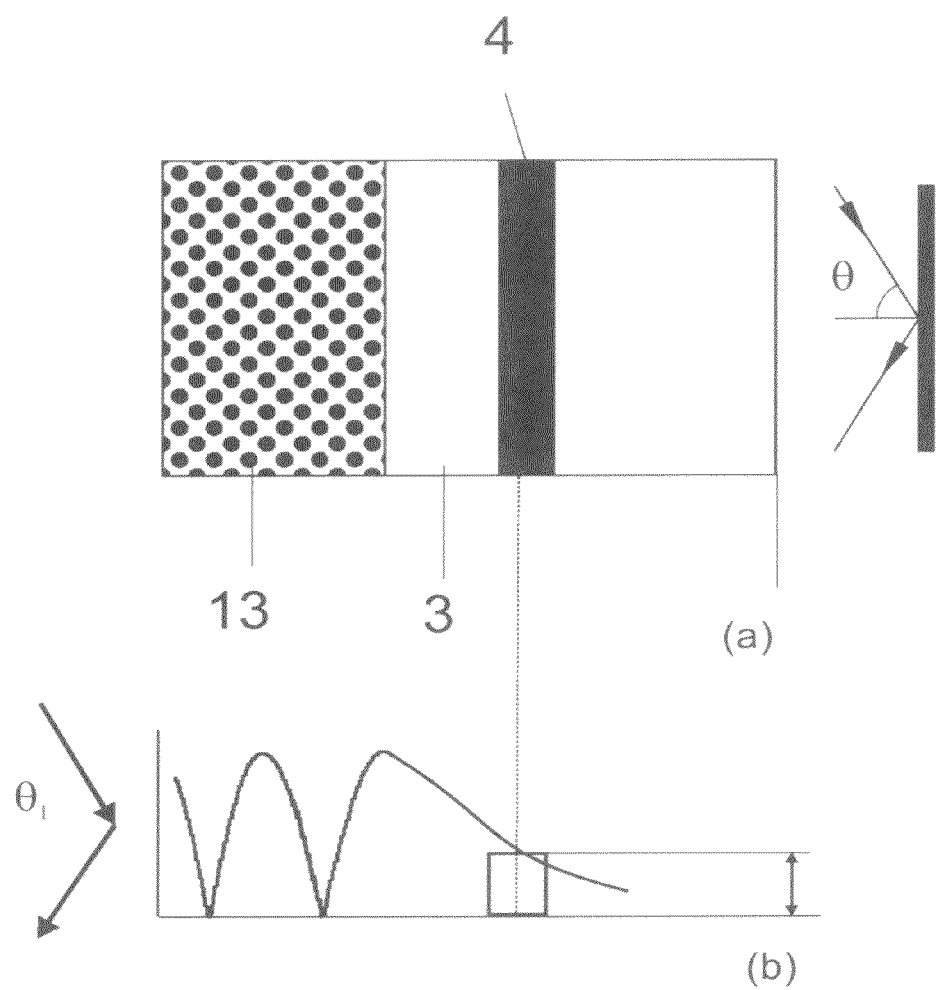
FIG. 4 (a) shows a case when the gain medium is incorporated into the layer of the evanescent reflector. The optical waves propagating within the medium partially penetrate into the reflector region (b).

FIG. 4 (a) illustrates a case when the gain medium is incorporated into the layer of the evanescent reflector. The optical waves propagating within the medium partially penetrate into the reflector region (b). Thus the optical waves of the passive cavity can be generated or amplified by the gain medium placed in the evanescent reflector, even when the intensity of the field in the gain region is small (for example, reduced by approximately a factor of 3 or more as compared to the maximum intensity of the impinging optical wave in the medium bordering the evanescent reflector). As the most of the intensity is concentrated now outside of the gain region the impact of the refractive index change of the semiconductor evanescent reflector may be minimized.

Figure 5:
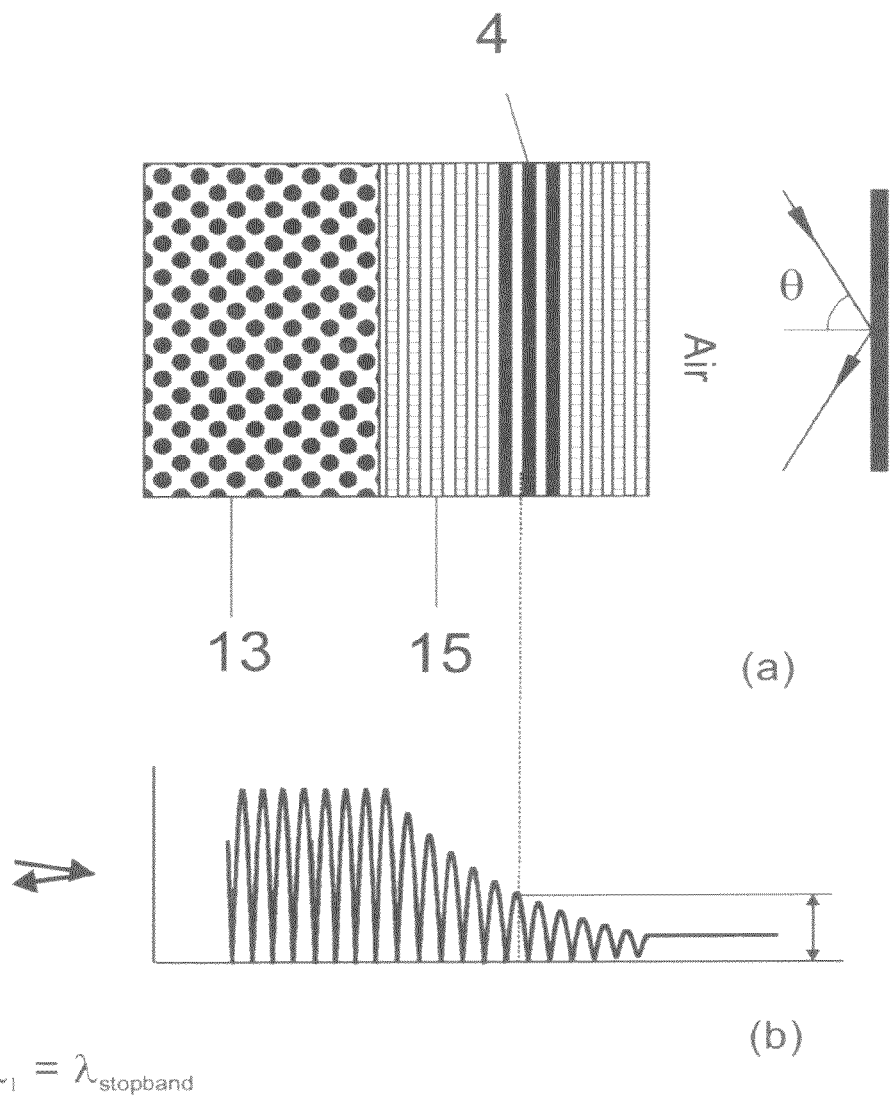
FIG. 5 (a) shows a case when the gain medium is incorporated deeply into the region of the multilayer interference reflector, for example, distributed Bragg reflector (DBR).

FIG. 5 (a) shows a case when the gain medium is incorporated deeply into the region of the multilayer interference reflector (15), for example, distributed Bragg reflector (DBR). In a simple DBR case gain regions are incorporated into the λ/4 DBR layers having alternating refractive indices. The optical waves at wavelengths corresponding to the DBR wavelength at a given angle partially penetrate into the reflector region. Thus the optical waves of the passive cavity can be generated or amplified by the gain medium placed in the DBR, even when the intensity of the field in the gain region is small (for example, reduced by approximately a factor of 3 or more as compared to the maximum intensity of the impinging optical wave in the medium bordering the DBR reflector). As the most of the intensity is concentrated now outside of the gain region the impact of the refractive index change of the semiconductor DBR reflector on the overall effective refractive index of the impinging modes may be minimized.

To overcome the problems of the prior art devices of FIGS. 1 and 2 a novel approach is introduced and illustrated in FIGS. 6-13 provided only as basic examples.

FIG. 6 shows a device of the present invention. An optical mode exists in the passive waveguide region. As an example, a diffraction grating acting as a tool for wavelength stabilization is introduced in the passive waveguide. Optical field of the mode partially overlaps with the gain medium placed in the evanescent reflector or the multilayer interference reflector. The effective refractive index of the optical mode propagating through the waveguide (16) is designed to match the required temperature dependence by using layers with positive and/or negative thermal coefficients of the refractive index. As the gain region is decoupled from the maximum intensity of the optical field in the passive cavity (17), an arbitrary engineering of the refractive index temperature dependence is possible. Different approaches can be used for wavelength stabilization by forming patterns in the passive waveguide region: ion implantation, etching, forming nanoimprint structures, volume Bragg gratings, photonic crystal structures, plasmonic structures and so on. Once the waveguide is passive and does not contain gain medium, no impact on its degradation or on nonradiative recombination may be expected once the waveguide structure is transmitted to light generated in the evanescent reflector.

Figure 7:
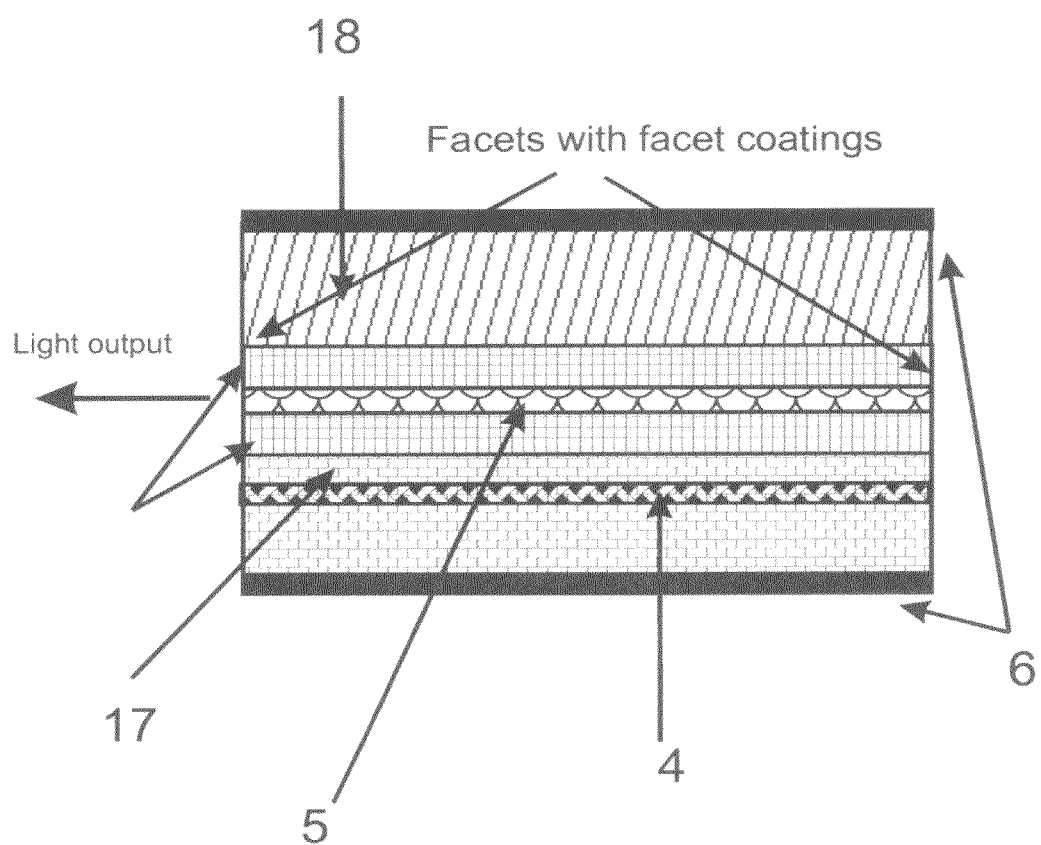
FIG. 7 shows a schematic representation of the device of the present invention. An optical cavity region represents a passive waveguide structure clad by two evanescent reflectors having a smaller index of refraction. An optical gain region is placed inside the evanescent reflector and contains tools of gain generation.

A more detailed description is given also in FIG. 7. FIG. 7 shows a schematic representation of the device of the present invention. An optical cavity region represents a passive waveguide structure clad by two evanescent reflectors (3, 18) having a smaller index of refraction. An optical gain region is placed inside the evanescent reflector (3) and contains tools of gain generation, in this case by current injection of nonequilibrium carriers into the p-n junction with the gain medium. A diffraction grating (5) is etched inside or close to the passive waveguide in such a way that the optical modes of the passive cavity interact with the grating exhibiting constructive or destructive interference depending on the wavelength. Ohmic metal contacts (6) are provided to ensure low electrical resistance of the structure. As the waveguide structure is passive, post fabrication techniques like ion implantation can be amended to tune the wavelength precisely. The effective refractive index can be intentionally engineered to provide either negligibly weak or, as opposite, strong dependence of the refractive index on temperature.

Figure 8:
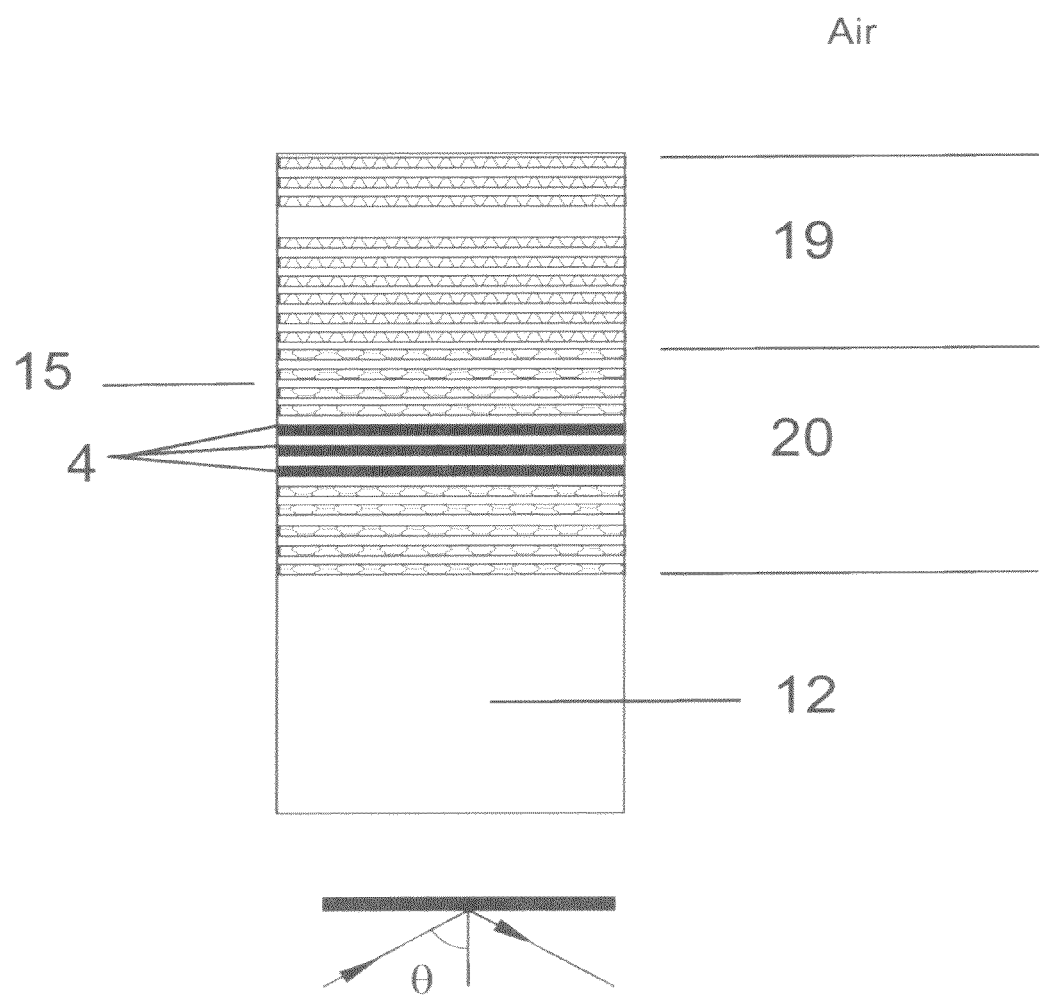
FIG. 8 shows a passive vertical optical cavity attached to a bottom active semiconductor DBR with inserted gain region or regions. The optical modes propagate into the reflector (DBR) region, where these modes can be amplified.

A similar approach but realized for surface-emitting geometry of the device is illustrated in FIG. 8.

FIG. 8 shows a passive vertical optical cavity (9) attached to a bottom active semiconductor DBR (20) with inserted gain region or regions. The optical modes propagate into the reflector (DBR) region, where these modes can be amplified. The passive active cavity is composed of materials providing the necessary temperature dependence of the refractive index to ensure the desired temperature dependence of the wavelength of the emitted photons. The effective refractive index of the optical mode in the passive waveguide is designed to match the required temperature dependence by using layers with positive and/or negative thermal coefficients of the refractive index. As the gain region is decoupled from the maximum intensity of the optical field, an arbitrary engineering of the refractive index temperature dependence is possible. Different approaches can be used for adjusting wavelength stabilization on top of the DBR-clad cavity approach, for example by forming patterns in the passive waveguide region: ion implantation, etching, forming nanoimprint structures, volume Bragg gratings, photonic crystal structures, plasmonic structures and so on. Once the waveguide is passive and does not contain gain medium, no impact on its degradation or on nonradiative recombination may be expected once the waveguide structure is transmitted to light generated in the evanescent reflector. As the waveguide structure is passive, post fabrication techniques like ion implantation can be amended to tune the wavelength precisely. The effective refractive index can be intentionally engineered to provide either negligibly weak or, as opposite, strong dependence of the refractive index on temperature.

Similarly, the approach may be extended to edge- or surface-emitting lasers and light emitting diodes fabricated in the "tilted cavity" or "tilted wave" approaches.

Furthermore, by introducing coupled passive cavities in edge or in surface-emitting geometry multiple wavelength wavelength-temperature-controlled lasing becomes possible.

Figure 9:
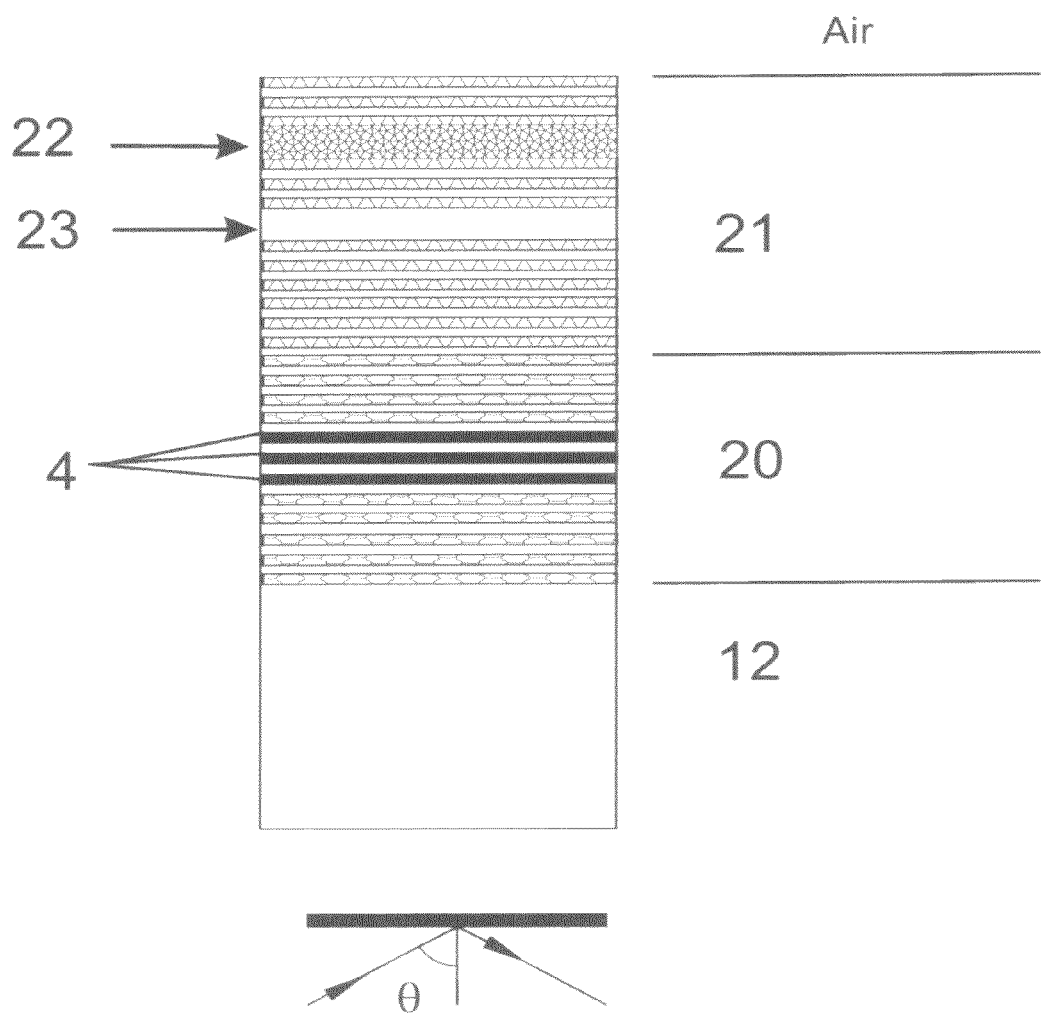
FIG. 9 shows a passive double vertical optical cavity attached to a bottom active semiconductor DBR with inserted gain region or regions.

FIG. 9 shows a passive double vertical optical cavity (21) attached to a bottom active semiconductor DBR with inserted gain region or regions. The optical modes propagate into the reflector (DBR) region, where these modes can be amplified. The passive cavities (22, 23) are composed of materials providing different temperature dependencies of the refractive index to ensure the desired temperature dependence of the relative wavelength shift of the emitted light. In this case not only the wavelength of each of the modes can be controlled, but also a relative shift of the modes with respect to each other can be controlled. The latter effect may be important, for example, for excitation of terahertz radiation by double-wavelength illumination of photocathodes.

A similar approach can be applied for electrooptically wavelength-tunable lasers.

Figure 10:
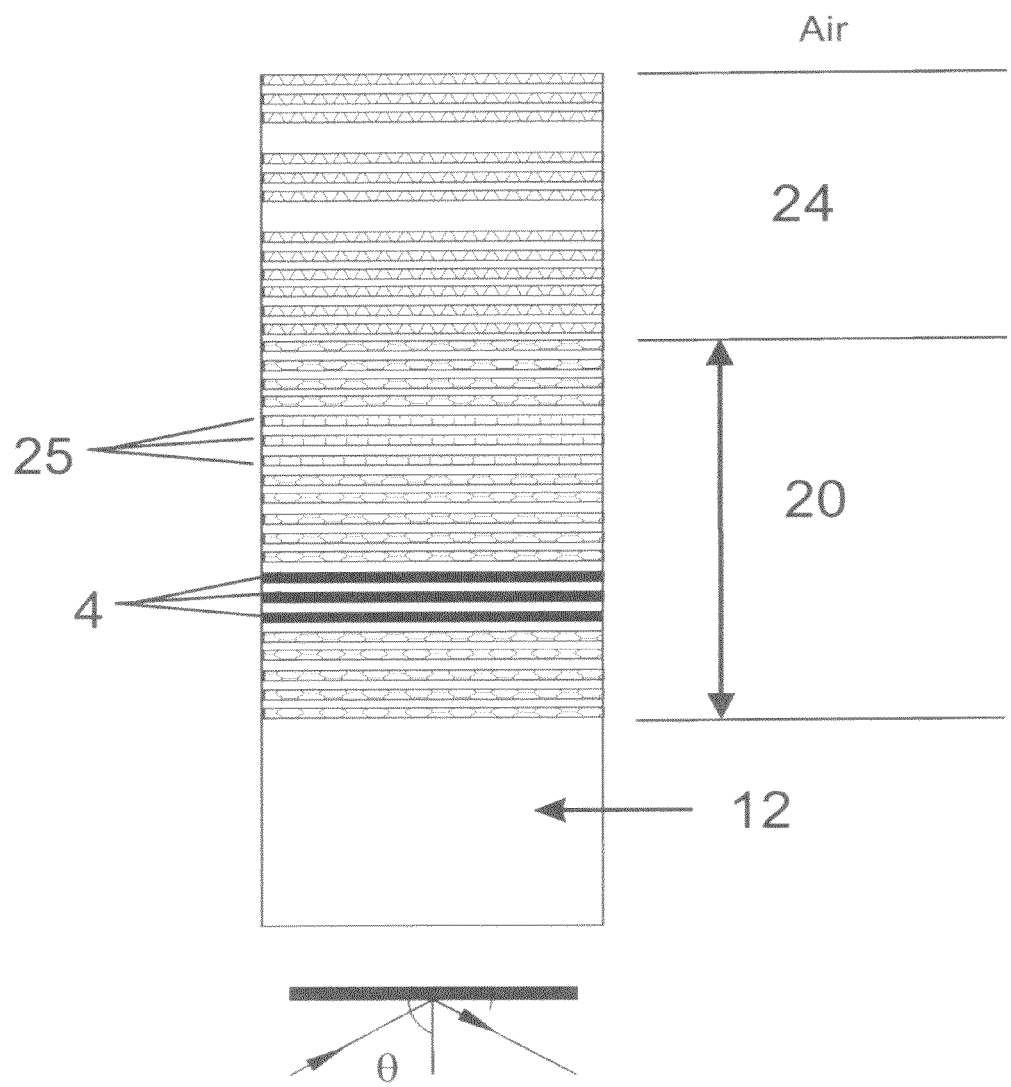
FIG. 10 shows a case when the multilayer interference reflector region composed of semiconductor layers (for example, DBR), is attached to a passive coupled vertical optical cavity composed of two dielectric vertical cavity layers confined by dielectric DBRs.

FIG. 10 shows a case when the multilayer interference reflector region composed of semiconductor layers (for example, DBR), is attached to a passive coupled vertical optical cavity (24) composed of two dielectric vertical cavity layers confined by dielectric DBRs. Gain regions (4) are incorporated into the $\lambda/4$ DBR layers of the semiconductor DBR. Furthermore, regions with electro-optically active medium (25) are introduced into the same semiconductor DBR. Using the elecrooptically-active medium introduced in the DBR one can change the refractive index of the region where the amplified modes have a significant intensity. Now the vertically coupled modes can be modulated in wavelength and (or) intensity using electrooptic modulation but the desired temperature shift of the modes and their relative separation can be controlled by the proper design of the passive cavity.

Figure 11:
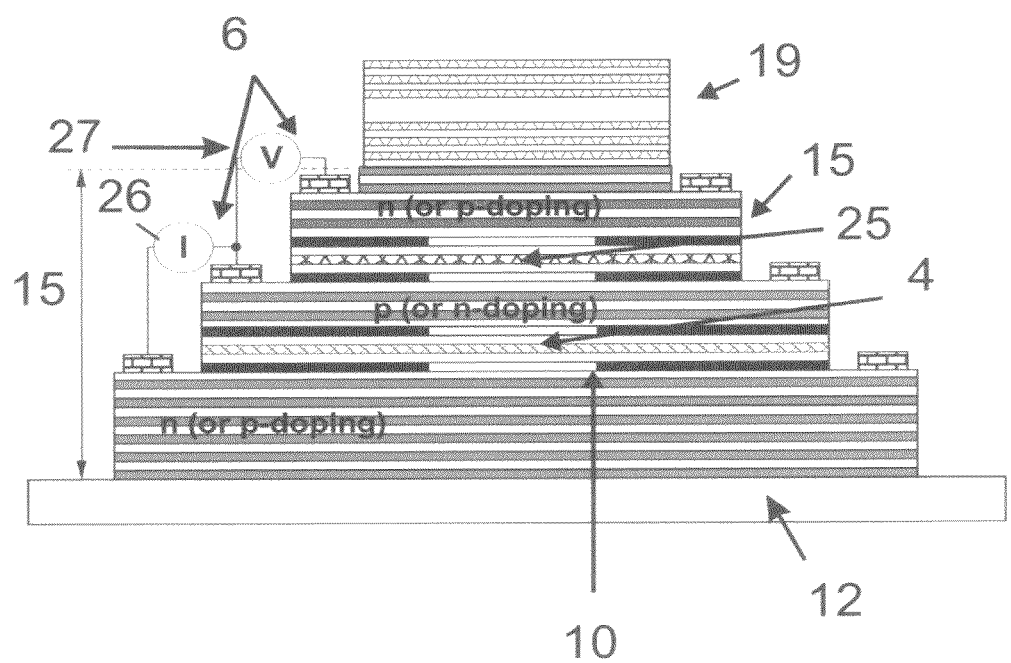
FIG. 11 shows an example of practical implementation of the light emitting device. Doped semiconductor Bragg reflector contains regions with gain medium and electro-optic medium, which have electric contacts.

FIG. 11. shows an example of practical implementation of the light emitting device. Doped semiconductor Bragg reflector contains regions with gain medium and electro-optic medium, which have electric contacts. No cavity region for the operation wavelength except of the passive cavity region exists. Forward bias (26) is applied to the gain section resulting in forward current. Gain is generated. Reverse modulated bias (27) is applied to the electro-optic section. A shift of the wavelength of the passive cavity mode occurs due to the interaction with the electrooptic section, where the refractive index is modulated. The temperature dependence of the mode can be controlled by the proper choice of the materials in the passive cavity.

Figure 12:
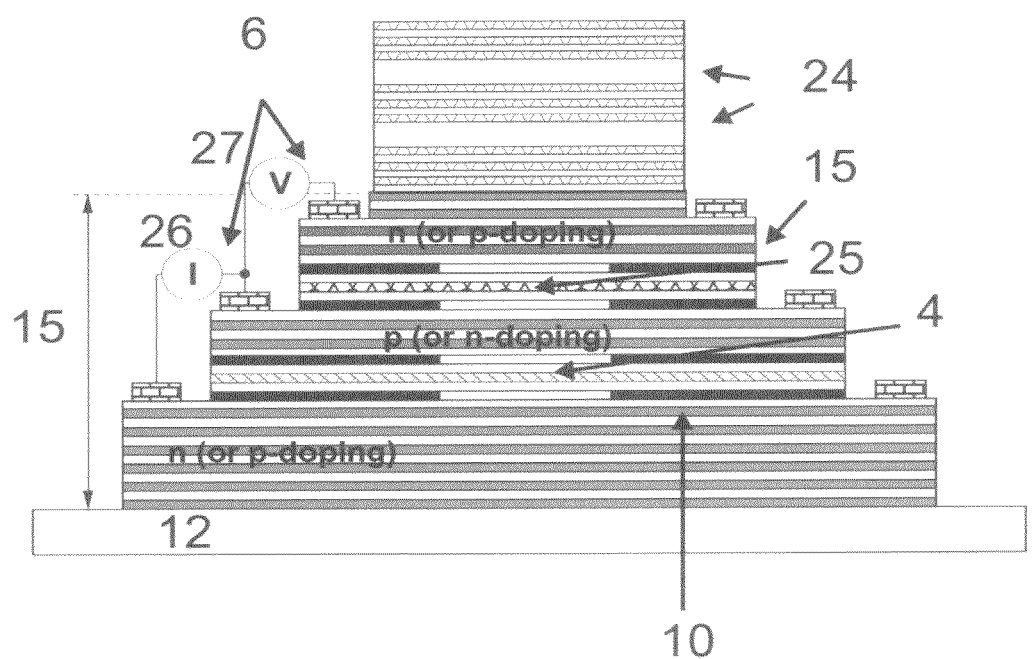
FIG. 12 shows an example of practical implementation of the light emitting device. Doped semiconductor Bragg reflector contains regions with gain medium and electro-optic medium, which have electric contacts.

FIG. 12 shows an example of practical implementation of the light emitting device with a double cavity. Doped semiconductor Bragg reflector contains regions with gain medium and electro-optic medium, which have electric contacts. No cavity region for the operation wavelength except of the passive cavity region exists. Forward bias is applied to the gain section resulting in forward current. Gain is generated. Reverse modulated bias is applied to the electro-optic section. Only one (the bottom cavity mode) of the two coupled vertical modes will be predominantly amplified as the quality factor of the top cavity is relatively lower. The active mode can be tuned by using the voltage applied to the modulator section causing the refractive index change both in wavelength and (or) in intensity. The temperature dependence of the modes can be controlled by the proper choice of the materials in the passive cavity.

Wavelength temperature stabilized lasers can be used in multiple applications also in the external cavity design. This is also correct for longitudinal photonic crystal lasers, tilted cavity lasers and tilted wave lasers.

Figure 13:
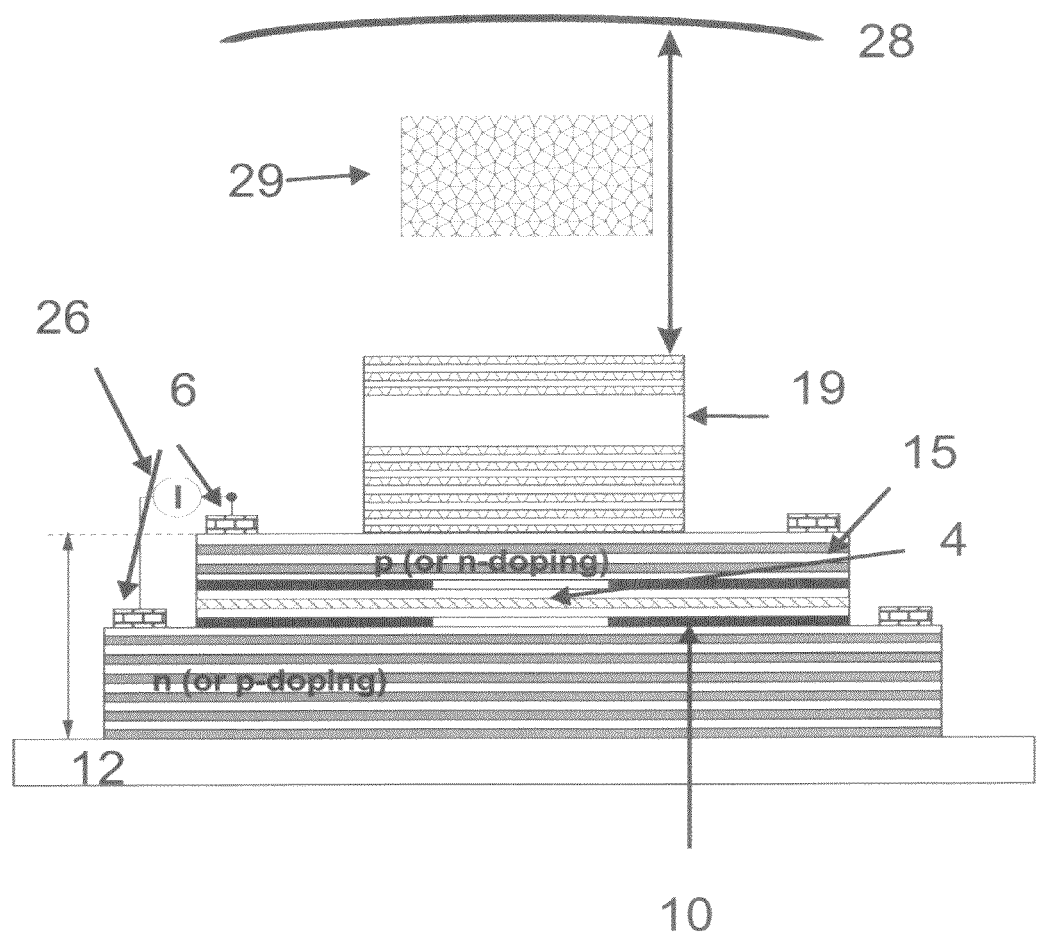
FIG. 13 shows a device in the external cavity geometry.

FIG. 13 shows a case when the quality factor of the passive cavity is not sufficient to achieve lasing. When the external cavity defined by an additionally introduced external mirror the external losses are reduced, and the lasing wavelength is defined by the longitudinal mode of the integrated resonator which includes the external resonator and the passive cavity. For example, in case the passive cavity mode has shows no dependence of the resonant wavelength on temperature, or the change is small and negative, the wavelength of the combined mode will not be strongly affected by the temperature change simplifier the system design, for example, the design of the device for intracavity frequency conversion. In the latter case a non-linear crystal (29) is to be introduced into the external cavity.

External cavity laser can be realized in different approaches. For example, the passive cavity may include dielectric, air, and semiconductor layers. Multilayer Bragg reflectors or volume Bragg gratings or subwavelength gratings can be used for wavelength selection. Several passive cavity devices can be produced from a single wafer or combined on a single carrier. The external cavity devices can be made from the array and operated at the same or at different wavelength defined by the mirrors including, for example, subwavelength grating or sections of grating coupled to the particular devices.

Figure 14:
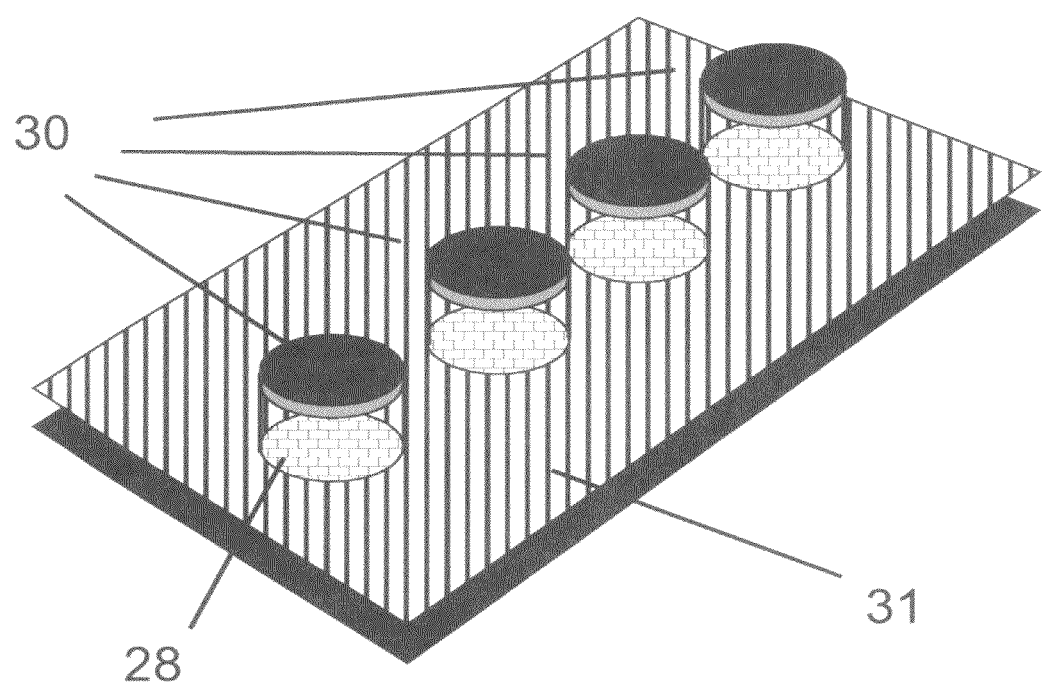
FIG. 14 shows an array of devices coupled to external mirrors on a single carrier.

FIG. 14 shows a schematic representation of the array of several passive cavity devices (30). The devices can be formed on the same substrate or introduced to a carrier material.

The arrays may be coupled to waveguides (31) such as glass or plastic optical waveguides such as optical fibers or silicon or glass-based based planar waveguides with the necessary routing and coupling means like photonic crystals, refractive index steps, plasmonic waveguides and lenses, glass lenses or mirrors etched in the waveguides.

An additional functionality, similarly to typically utilized to other semiconductor devices, can be applied for structures with angle selective amplification of optical emission. This may include, for example, but not limited to, regions with electro-absorptive or electro-refractive regions. Mode-locked and self-pulsating devices with angle-selective emission can be fabricated.

The devices described may include heavily doped contact layers, metal contacts, contain means of injection of nonequilibrium carriers by current injection, electron beam excitation or photoexcitation, as it is well described in literature for conventional light-generating or light-amplifying devices.

The devices described may be additionally attached to semiconductor, metal or dielectric layers or multilayer structures, for example to high-finesse optical cavities, coupled cavities or multilayer Bragg reflectors, provide means of exciting of the optical cavity modes for multiple reasons. However, unless the conditions of the present invention of angle-selective amplification are fulfilled, the improved directionality of the optical emission will follow. Different types of devices including light-emitting diodes, laser diodes, and cascade lasers can be utilized in this approach and provide improved directionality of the beam due to the angle selection. For multilayer reflectors the Bragg condition is even not obligatory, and the multilayer interference reflectors may contain non-periodic regions or the periodicity may be intentionally disturbed, while the functionality will still be maintained unless the amplification takes place in the reflector region and the refractive index change with temperature can be either compensated or enhanced.

The surfaces or interfaces of the device may contain different metal or dielectric patterns like photonic crystals, or metal plasmonic structures, magnetic layers and patterns. Different substrates and materials can be applied for epitaxial growth or vapor or vacuum deposition. For example, but not limited to (Al,Ga,In)(As,P,Sb,N) alloys or binary materials can be used, for example being epitaxially grown on GaAs, GaSb or InP substrates using molecular beam epitaxy or metal-organic chemical vapor deposition. Multilayers made of (In,Ga,Al)N materials on GaN, sapphire or silicon substrates can be applied for growth of devices in the UV-green spectral range. Polymer materials can be used both as active reflectors and passive cavities. Any combination which meets the condition of the passive waveguide as described above matches the invention.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which are embodied within a scope encompassed and equivalents thereof with respect to the features set out in the appended claims. Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A device which is composed of:
   (a) a reflector providing at least one reflectivity stopband,
   (b) a gain region with means of generating optical gain introduced into at least one layer of said reflector,
   (c) a gain spectrum of said gain region overlapping with the reflectivity stopband of said reflector,
   (d) a passive optical cavity attached to said reflector such that a small fraction of the optical field of the passive cavity optical mode penetrates into the gain region placed in the reflector,
   wherein said passive optical cavity has a resonance wavelength, and
   wherein a requested temperature dependence of said resonance wavelength of the said optical mode is realized,
   wherein said requested temperature dependence is selected from the group including
      (i) a positive thermal shift of said resonance wavelength, and
      (ii) a negative thermal shift of said resonance wavelength; and
   wherein each of the possibilities of (i) through (ii) can be realized.

2. The device of claim 1 wherein the reflector is chosen from group of devices consisting of:
   (a) distributed Bragg reflector,
   (b) evanescent reflector, and
   (c) a combination of (a) and (b).

3. The device of claim 1 wherein the optical gain medium is chosen from the group of:
   (a) bulk material,
   (b) quantum well material,
   (c) quantum wire material,
   (d) quantum dot material, and
   (e) and combination of (a) through (d).

4. The device of claim 1 wherein the device is attached to the medium selected form a group of:

(a) bulk medium,
(b) multilayer medium, and
(c) three-dimensionally patterned medium.

5. The device of claim 4 wherein the materials of the attached medium are chosen from a group of:
(a) dielectric materials,
(b) metals, and
(c) semiconductor materials.

6. The device of claim 5 wherein the attached medium represents:
(a) one or more multilayer interference reflector, or
(b) one or more optical cavities confined by interference reflectors, or
(c) one or more optical cavities confined by evanescent reflectors.

7. The device of claim 1 further including a reflector section with medium providing an electro-optic effect by means of:
(a) application of voltage to this section via Stark, Quantum-Confined Stark or Franz-Keldysh effects, or
(b) application of current to this section resulting in electron-hole plasma-induced electrooptic effect.

8. The device of claim 1 acting as a device chosen from a group consisting of:
(a) optical amplifier for the transmitted light,
(b) optical amplifier for the reflected light,
(c) light emitting diode,
(d) superluminescent light emitting diode,
(e) edge emitting laser,
(f) tilted wave laser,
(g) tilted cavity laser,
(h) laser with evanescent light outcoupling,
(i) vertical cavity surface emitting laser,
(k) microdisc laser,
(l) external cavity laser, and
(m) any combination of (a) through (l).

9. The device of claim 7, which provides a tuning of the light wavelength by the electrooptic modulaion of the refractive index in the reflector region.

10. The device of claim 7, further comprising at least two structural elements,
wherein said two structural elements are selected from the group consisting of:
(a) at least two cavities,
(b) at least two multilayer interference reflectors,
(c) at least two evanescent reflectors, and
(d) at least one multilayer interference reflector and at least one evanescent reflector,
wherein said at least two structural elements are selected such that they support at least two resonance optical modes,
wherein the interaction of said at least two optical modes is changed by the change of the refractive index in said reflector section.

11. The device of claim 10 wherein applying of the electrooptical effect to said reflector section results in the operation of said device selected from the group consisting of
(a) tuning of the wavelength of the emitted light,
(b) tuning of the intensity of light at the exit of said device, and
(c) any combination of (a) and (b).

12. The device of claim 1, further comprising means of gain generation by current injection or photoexcitation.

13. The device of claim 1 further comprising at least one lateral aperture regions used to confine areas of current injection and/or electrooptic effect,
wherein said at least one aperture region is produced by a method selected from the group of methods including
(a) selective oxidation of specially introduced Al-rich layers, or
(b) selective etching off a specially introduced layer with an enhanced etching rate for an etchant used, and
(c) a combination of (a) and (b).

14. The device of claim 1 wherein the temperature shift of the emitted wavelength is below 0.04 nm/K and, in particular, below 0.03 nm/K.

15. The device of claim 1 wherein the temperature shift of the emitted wavelength is positive and above 0.08 nm/K and, in particular, above 0.1 nm/K.

16. The device of claim 1 wherein the temperature shift of the emitted wavelength is negative and in absolute value exceeds 0.01 nm.

17. The external cavity laser of claim 8 further comprising a wavelength-selective mirror selected from a group consisting of:
(a) multilayer Bragg reflector,
(b) volume Bragg grating,
(c) subwavelength grating, and
(d) any combination of (a) through (c).

18. The device of claim 8 which includes several elements coupled to one or several mirrors to operate at the same or at different wavelength.

19. The device of claim 17 coupled to at least one optical waveguide selected from the group consisting of:
(a) optical fiber,
(b) plastic waveguides,
(c) planar glass waveguides and
(d) planar Si-based waveguides.

20. The device of claim 18 wherein the mirror is directly attached to the waveguide with means of coupling to the waveguide selected from a group consisting of:
(a) etched groves,
(b) lenses, and
(c) a combination of (a) and (b).

21. The device of claim 18 coupled to at least one optical waveguide selected from the group consisting of:
(a) optical fiber,
(b) plastic waveguides,
(c) planar glass waveguides, and
(d) planar Si-based waveguides.

22. The device of claim 19 wherein the mirror is directly attached to the waveguide with means coupling to the waveguide selected from a group consisting of:
(a) etched groves,
(b) lenses, and
(c) combination of (a) and (b).

* * * * *